(12) United States Patent
Wu

(10) Patent No.: US 10,811,399 B1
(45) Date of Patent: Oct. 20, 2020

(54) OPTICAL SENSING CHIP PACKAGING STRUCTURE

(71) Applicant: TAIWAN ELECTRONIC PACKAGING CO., LTD., Zhubei, Hsinchu County (TW)

(72) Inventor: Cherng-Chiao Wu, Zhubei (TW)

(73) Assignee: TAIWAN ELECTRONIC PACKAGING CO., LTD., Zhubei (TW)

( * ) Notice: Subject to any disclaimer, the term of this patent is extended or adjusted under 35 U.S.C. 154(b) by 0 days.

(21) Appl. No.: 16/366,749

(22) Filed: Mar. 27, 2019

(51) Int. Cl.
*H01L 25/16* (2006.01)
*H01L 31/0232* (2014.01)
*H01L 31/02* (2006.01)
*H01L 31/0203* (2014.01)

(52) U.S. Cl.
CPC ........ *H01L 25/167* (2013.01); *H01L 31/0203* (2013.01); *H01L 31/02005* (2013.01); *H01L 31/02325* (2013.01)

(58) Field of Classification Search
CPC ............. H01L 25/167; H01L 31/02325; H01L 31/12–173
See application file for complete search history.

(56) References Cited

U.S. PATENT DOCUMENTS

2006/0170774 A1* 8/2006 Coppola .............. H04N 17/002
348/175
2016/0141440 A1* 5/2016 Chun .................... H01L 31/173
257/82

FOREIGN PATENT DOCUMENTS

EP    2171811 B1 *  5/2015    .........  H01S 5/02248

* cited by examiner

*Primary Examiner* — Daniel P Shook
(74) *Attorney, Agent, or Firm* — Birch, Stewart, Kolasch & Birch, LLP

(57) ABSTRACT

An optical sensing chip packaging structure includes a substrate, an optical sensing member, a light emitting member and a transparent cover plate. The substrate has a recess; the optical sensing member is positioned in the recess, and is electrically connected to the substrate. The light emitting member is positioned in the recess, and is electrically connected to the substrate or the optical sensing member. The transparent cover plate is positioned on the substrate, and covers the optical sensing member and the light emitting member.

20 Claims, 6 Drawing Sheets

OPTICAL SENSING CHIP PACKAGING STRUCTURE

BACKGROUND OF THE INVENTION

1. Technical Field

The present invention is related to a chip packaging structure, and more particularly to an optical sensing chip packaging structure.

2. Description of Related Art

FIG. 1 is a cross-sectional view of a conventional optical sensing chip packaging structure 100, which is composed of a substrate 120, an optical sensing member 140, a light emitting member 160 and a transparent glue layer 180. The optical sensing member 140 is positioned in a recess 122 of the substrate 120, and the light emitting member 160 is positioned on the optical sensing member 140. The transparent glue layer 180 is positioned in the recess 122, and covers the optical sensing member 140 and the light emitting member 160.

However, the transparent glue layer 180 of the optical sensing chip packaging structure 100 is directly exposed, so it is easy to be adhered to dust or dirt, and therefore the optical sensing member 140 would provide an imprecise sensing result. For example, when someone taking the optical sensing chip packaging structure 100 easily contacts or presses the transparent glue layer 180 of the optical sensing chip packaging structure 100, it is possible to make the optical sensing member 140 providing an imprecise sensing result, and even to make the optical sensing member 140 to lose efficiency.

At least for the above reasons, the conventional optical sensing chip packaging structure 100 still has room for improvements.

BRIEF SUMMARY OF THE INVENTION

In view of the above, the primary objective of the present invention is to provide an optical sensing chip packaging structure, which use a transparent cover plate covering an optical sensing member and a light emitting member, whereby to prevent dust or dirt from adhering to the optical sensing member and the light emitting member, and possibly to prevent someone from contacting or pressing the optical sensing member and the light emitting member, so as to protect the optical sensing chip packaging structure.

The present invention provides an optical sensing chip packaging structure includes a substrate, an optical sensing member, a light emitting member and a transparent cover plate. The substrate has a recess; the optical sensing member is positioned in the recess, and is electrically connected to the substrate. The light emitting member is positioned in the recess, and is electrically connected to the substrate or the optical sensing member. The transparent cover plate is positioned on the substrate, and covers the optical sensing member and the light emitting member.

With the aforementioned design, by covering the transparent cover plate over an optical sensing member and a light emitting member, the optical sensing chip packaging structure could prevent dust or dirt from adhering to the optical sensing member and the light emitting member, and could prevent someone from contacting or pressing the optical sensing member and the light emitting member, so as to protect the optical sensing chip packaging structure. Therefore, a sensing precision of the optical sensing member and an entire reliability of the optical sensing chip packaging structure could be further enhanced.

BRIEF DESCRIPTION OF THE SEVERAL VIEWS OF THE DRAWINGS

The present invention will be best understood by referring to the following detailed description of some illustrative embodiments in conjunction with the accompanying drawings, in which.

DETAILED DESCRIPTION OF THE INVENTION

Figure 1:
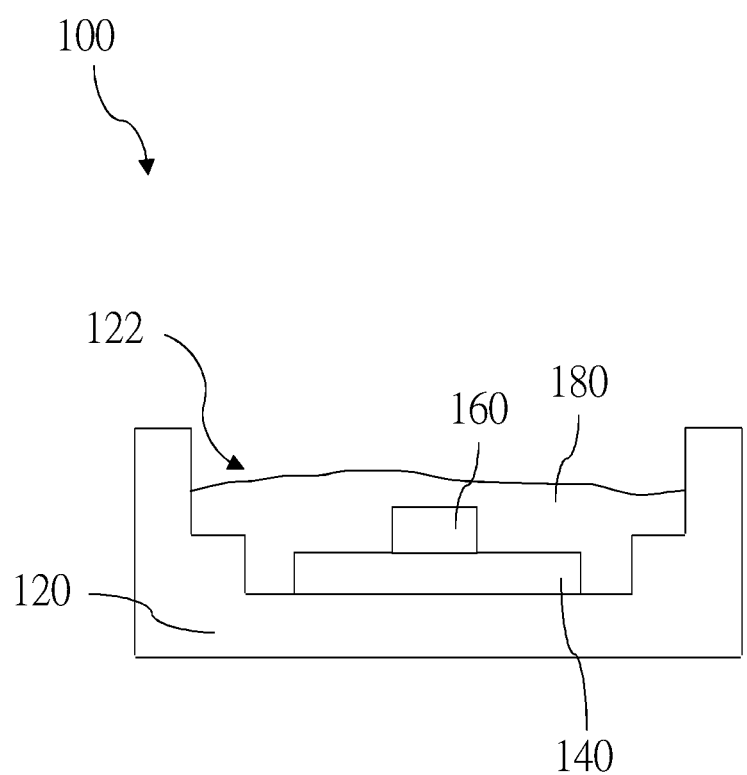
FIG. 1 is a cross-sectional view of the conventional optical sensing chip packaging structure.
Figure 2:
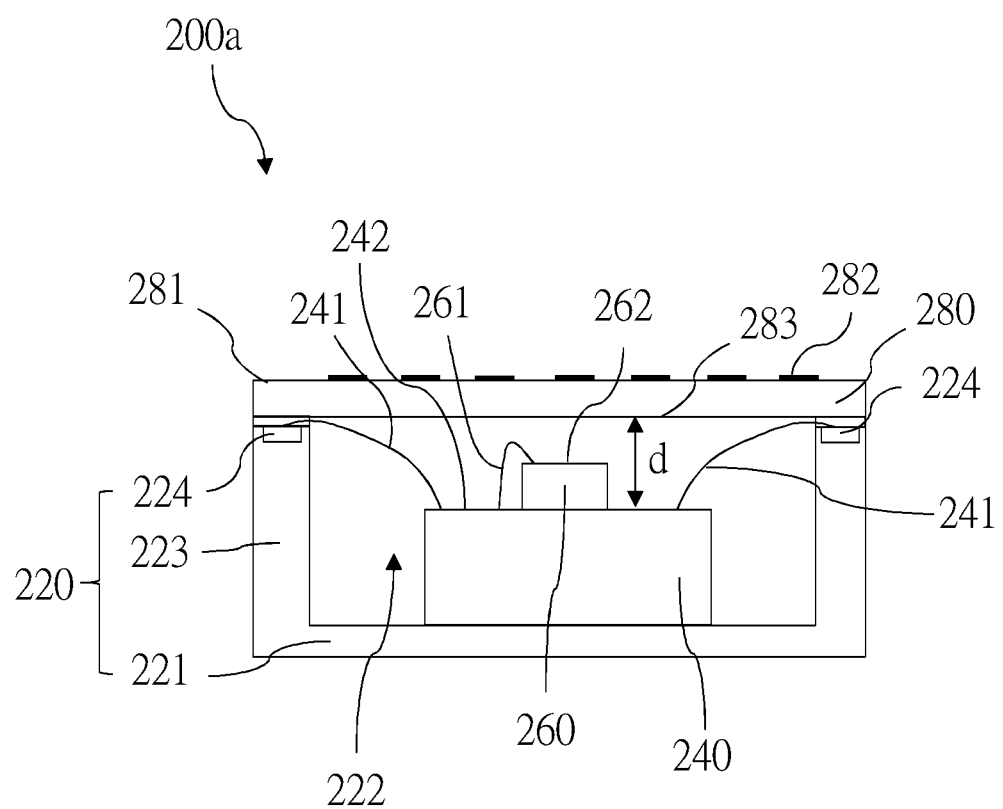
FIG. 2 is a cross-sectional view of the optical sensing chip packaging structure of the first embodiment of the present invention.

As illustrated in FIG. 2, an optical sensing chip packaging structure 200a of the first embodiment of the present invention includes a substrate 220, an optical sensing member 240, a light emitting member 260 and a transparent cover plate 280. In the first embodiment of the present invention, the substrate 220 has a recess 222. The substrate 220 has a plurality of circuit bonded points 224; the optical sensing member 240 is positioned in the recess 222 of the substrate 220, and is electrically connected to the bonded points 224 of the substrate 220 through at least one conductive wire 241. In the first embodiment of the present invention, the substrate 220 includes a bottom wall 221 and side walls 223, wherein the bottom wall 221 and the side walls 223 are connected to form the recess 222. In the first embodiment of the present invention, the bonded points 224 are positioned on a top of the side walls 223, and one end of the conductive wire 241 is connected to the optical sensing member 240 while another end thereof is connected to one of the bonded points 224.

The light emitting member 260 is positioned on the optical sensing member 240, and is electrically connected to the substrate 220 or the optical sensing member 240. In the first embodiment of the present invention, the light emitting member 260 is positioned on the optical sensing member 240, and is electrically connected to the optical sensing member 240 through at least one conductive wire 261. In FIG. 2, one end of the conductive wire 261 is connected to the light emitting member 260, and another end thereof is connected to the optical sensing member 240.

In the first embodiment of the present invention, the light emitting member 260 has a light emitting surface 262, and the optical sensing member 240 has an optical sensing surface 242, wherein the optical sensing surface 242 of the optical sensing member 240 is adapted to sense light emitted from the light emitting member 260. In one purpose of the present invention, the optical sensing chip packaging structure 200a can be adapted to sense an object which is in front of the optical sensing chip packaging structure 200a or not. The optical sensing chip packaging structure 200a can be used as a linear scale to detect an object which is moving relative to the optical sensing chip packaging structure 200a or not. In the first embodiment of the present invention, the light emitting member 260 is a spot light source, such as a light emitting diode or a laser source, but is not limited thereto. In the first embodiment of the present invention, the light emitting surface 262 of the light emitting member 260 and the optical sensing surface 242 of the optical sensing member 240 are substantially in the same direction, whereby both of them face to the transparent cover plate 280, and therefore when light emitted from the light emitting surface 262 of the light emitting member 260 is reflected by the object, an angle between the incident light and the reflected light could be as smaller as possible in order to provide a more precise measuring value.

The transparent cover plate 280 is positioned on the substrate 220, and covers the optical sensing member 240 and the light emitting member 260. In the first embodiment of the present invention, a distance d from the optical sensing surface 242 to a bottom surface of the transparent cover plate 280 is less than or equals to 0.8 mm. If the distance d becomes greater, a diffused area of the reflected light emitted from the light emitting member 260 would become greater, whereby to increase signal interference of the optical sensing member 240. In contrast, if the distance d becomes less, the diffused area of the reflected light emitted from the light emitting member 260 would become less, and therefore the optical sensing member 240 could have a better signal resolution, so as to increase a measure preciseness of the optical sensing chip packaging structure 200a.

In the first embodiment of the present invention, the transparent cover plate 280 includes an optical grating 282, which is positioned on a top surface 281 of the transparent cover plate 280. The optical grating 282 is fixedly positioned on the top surface 281 of the transparent cover plate 280, so the relative positions of the optical grating 282, the optical sensing member 240 and the light emitting member 260 are fixed. In the other words, the optical grating 282 has been aligned at a correct position, so there is no need to adjust the relative positions of the optical grating 282, the optical sensing member 240 and the light emitting member 260. Therefore, compared to a separated and independent arrangements of an optical grating and the conventional optical sensing chip packaging structure, the optical sensing chip packaging structure 200a according to the first embodiment of the present invention could provide a better measure stability and reproducibility.

Figure 3:
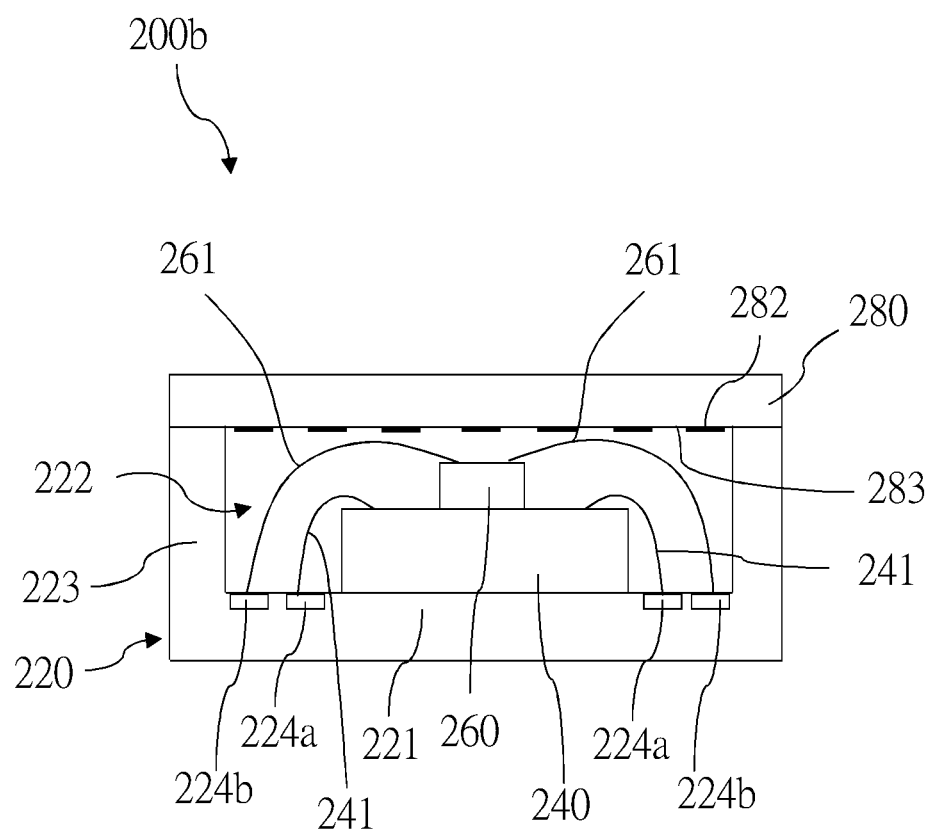
FIG. 3 is a cross-sectional view of the optical sensing chip packaging structure of the second embodiment of the present invention.

Referring to FIG. 3, an optical sensing chip packaging structure 200b of the second embodiment of the present invention includes a substrate 220, an optical sensing member 240, a light emitting member 260 and a transparent cover plate 280. The optical sensing chip packaging structure 200b of the second embodiment of the present invention is similar to the optical sensing chip packaging structure 200a of the first embodiment. However, the difference between the both is that, the positions of the bonded points 224a, 224b and the optical grating 282 of the optical sensing chip packaging structure 200b are different from that of the optical sensing chip packaging structure 200a.

In the second embodiment of the present invention, the substrate 220 has a plurality of circuit bonded points 224a, 224b; the optical sensing member 240 is positioned in the recess 222 of the substrate 220, and is electrically connected to the bonded points 224a of the substrate 220 through at least one conductive wire 241. In the second embodiment of the present invention, the bonded points 224a are positioned on the bottom wall 221, and one end of the conductive wire 241 is connected to the optical sensing member 240 while another end thereof is connected to one of the bonded points 224a.

The light emitting member 260 is positioned on the optical sensing member 240, and is electrically connected to the bonded points 224b of the substrate 220 through at least one conductive wire 261. In FIG. 3, the bonded points 224b are positioned on the bottom wall 221, and one end of the conductive wire 261 is connected to the light emitting member 260 while another end thereof is connected to the bonded points 224b of the substrate 220.

In the second embodiment of the present invention, the transparent cover plate 280 includes an optical grating 282, which is positioned on a bottom surface 283 of the transparent cover plate 280. The optical grating 282 is fixedly positioned on the bottom surface 283 of the transparent cover plate 280, so the relative positions of the optical grating 282, the optical sensing member 240 and the light emitting member 260 are fixed. In the other words, the optical grating 282 has been aligned at a correct position, so there is no need to adjust the relative positions of the optical grating 282, the optical sensing member 240 and the light emitting member 260. Therefore, compared to a separated and independent arrangements of an optical grating and the conventional optical sensing chip packaging structure, the optical sensing chip packaging structure 200b according to the second embodiment of the present invention could provide a better measure stability and reproducibility.

Figure 4:
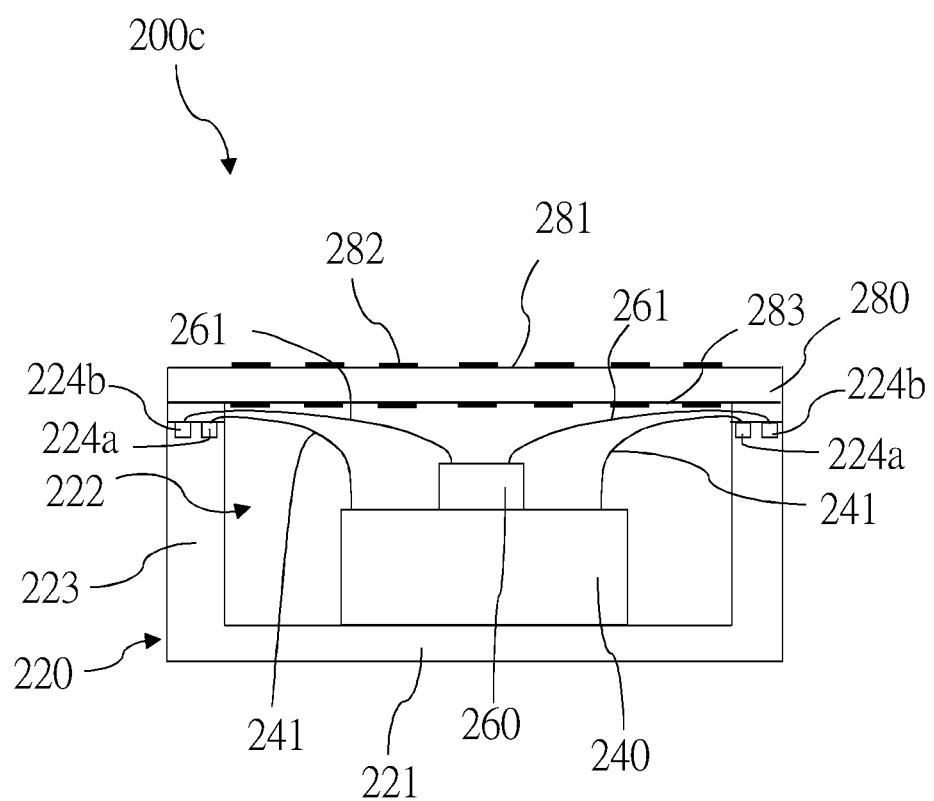
FIG. 4 is a cross-sectional view of the optical sensing chip packaging structure of the third embodiment of the present invention.

Referring to FIG. 4, an optical sensing chip packaging structure 200c of the third embodiment of the present invention includes a substrate 220, an optical sensing member 240, a light emitting member 260 and a transparent cover plate 280. The optical sensing chip packaging structure 200c of the third embodiment of the present invention is similar to the optical sensing chip packaging structure 200b of the second embodiment. However, the difference between the both is that, the positions of the bonded points 224a, 224b and the optical grating 282 of the optical sensing chip packaging structure 200c are different from that of the optical sensing chip packaging structure 200b.

In the third embodiment of the present invention, the substrate 220 has a plurality of circuit bonded points 224a, 224b; the optical sensing member 240 is positioned in the recess 222 of the substrate 220, and is electrically connected to the bonded points 224a of the substrate 220 through at least one conductive wire 241. In the third embodiment of the present invention, the bonded points 224a are positioned on a top of side walls 223, and one end of the conductive wire 241 is connected to the optical sensing member 240 while another end thereof is connected to one of the bonded points 224a.

The light emitting member 260 is positioned on the optical sensing member 240, and is electrically connected to the bonded points 224b of the substrate 220 through at least one conductive wire 261. In FIG. 4, the bonded points 224b are positioned on a top of the side walls 223, and one end of the conductive wire 261 is connected to the light emitting member 260 while another end thereof is connected to the bonded points 224b of the substrate 220.

In the third embodiment of the present invention, the transparent cover plate 280 includes an optical grating 282, which is respectively positioned on a top surface 281 and a bottom surface 283 of the transparent cover plate 280. The optical grating 282 is fixedly positioned on the top surface 281 and the bottom surface 283 of the transparent cover plate 280, so the relative positions of the optical grating 282, the optical sensing member 240 and the light emitting member 260 are fixed. In the other words, the optical grating 282 has been aligned at a correct position, so there is no need to adjust the relative positions of the optical grating 282, the optical sensing member 240 and the light emitting member 260. Therefore, compared to a separated and independent arrangements of an optical grating and the conventional optical sensing chip packaging structure, the optical sensing chip packaging structure 200c according to the third embodiment of the present invention could provide a better measure stability and reproducibility.

Figure 5:
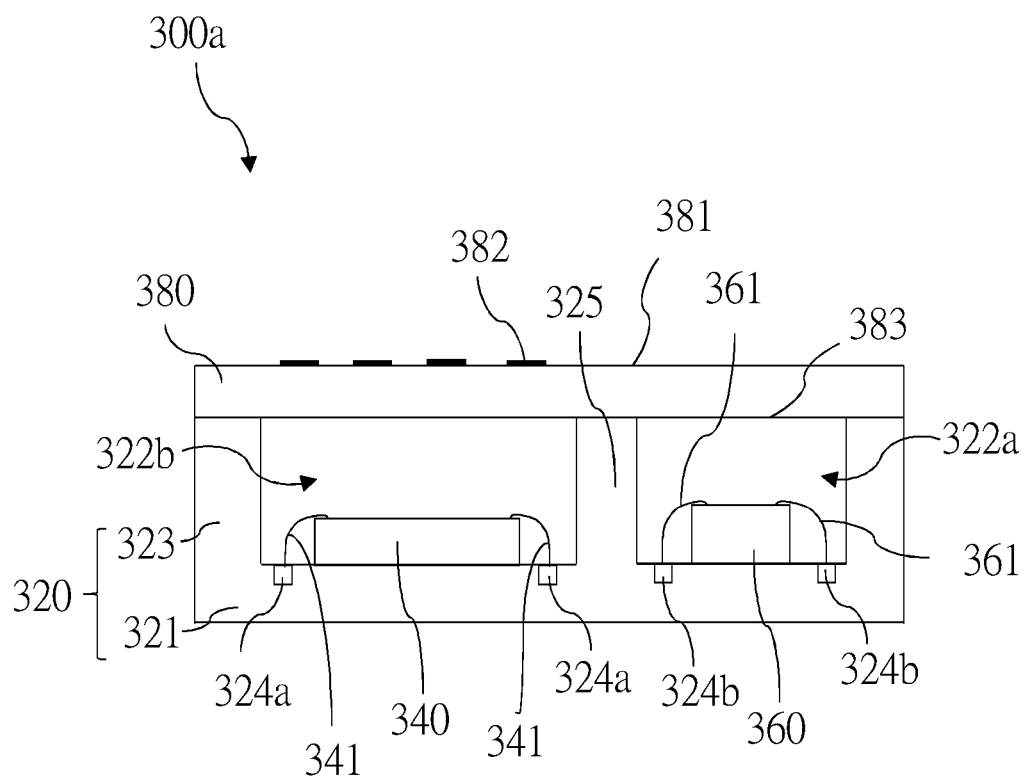
FIG. 5 is a cross-sectional view of the optical sensing chip packaging structure of the fourth embodiment of the present invention.

Referring to FIG. 5, an optical sensing chip packaging structure 300a of the fourth embodiment of the present invention includes a substrate 320, an optical sensing member 340, a light emitting member 360 and a transparent cover plate 380. In the fourth embodiment of the present invention, the substrate 320 includes a recess and a separation wall 325, wherein the separation wall 325 is positioned in the recess, so that the recess is separated to form a first accommodating space 322a and a second accommodating space 322b; the light emitting member 360 is positioned in the first accommodating space 322a, and the optical sensing member 340 is positioned in the second accommodating space 322b. In the fourth embodiment of the present invention, the separation wall 325 is an opaque separation wall. The substrate 320 has a plurality of circuit bonded points 324a, 324b; the optical sensing member 340 is electrically connected to the bonded points 324a of the substrate 320 through at least one conductive wire 341. In the fourth embodiment of the present invention, the substrate 320 includes a bottom wall 321 and side walls 323, wherein the bottom wall 321 and the side walls 323 are connected to form the recess. In the fourth embodiment of the present invention, the bonded points 324a are positioned on the bottom wall 321, and one end of the conductive wire 341 is connected to the optical sensing member 340 while another end thereof is connected to one of the bonded points 324a.

The light emitting member 360 is electrically connected to the substrate 320. In the fourth embodiment of the present invention, the light emitting member 360 is electrically connected to the bonded points 324b of the substrate 320 through at least one conductive wire 361. In FIG. 5, the bonded points 324b are positioned on the bottom wall 321, and one end of the conductive wire 361 is connected to the light emitting member 360 while another end thereof is connected to the bonded points 324b of the substrate 320.

The transparent cover plate 380 is positioned on the substrate 320, and covers the optical sensing member 340 and the light emitting member 360. In the fourth embodiment of the present invention, the transparent cover plate 380 includes an optical grating 382, which is positioned on a top surface 381 of the transparent cover plate 380. The optical grating 382 is fixedly positioned on the top surface 381 of the transparent cover plate 380, so the relative positions of the optical grating 382, the optical sensing member 340 and the light emitting member 360 are fixed. In the other words, the optical grating 382 has been aligned at a correct position, so there is no need to adjust the relative positions of the optical grating 382, the optical sensing member 340 and the light emitting member 360. Therefore, compared to a separated and independent arrangements of an optical grating and the conventional optical sensing chip packaging structure, the optical sensing chip packaging structure 300a according to the third embodiment of the present invention could provide a better measure stability and reproducibility.

Figure 6:
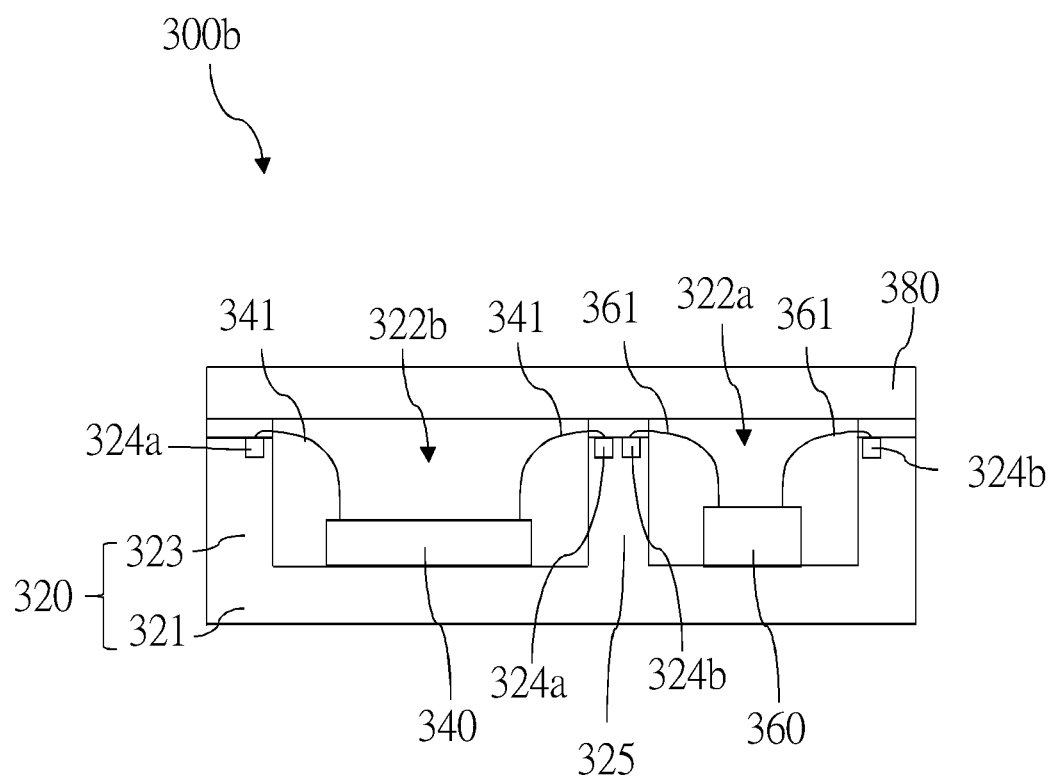
FIG. 6 is a cross-sectional view of the optical sensing chip packaging structure of the fifth embodiment of the present invention.

Referring to FIG. 6, an optical sensing chip packaging structure 300b of the fifth embodiment of the present invention includes a substrate 320, an optical sensing member 340, a light emitting member 360 and a transparent cover plate 380. The optical sensing chip packaging structure 300b of the fifth embodiment of the present invention is similar to the optical sensing chip packaging structure 300a of the fourth embodiment. However, the difference between the both is that, the positions of the bonded points 324a, 324b of the optical sensing chip packaging structure 300b are different from that of the optical sensing chip packaging structure 300a; besides, the transparent cover plate 380 of the optical sensing chip packaging structure 300b has no optical grating.

In the fifth embodiment of the present invention, the substrate 320 has a plurality of circuit bonded points 324a, 324b; the optical sensing member 340 is electrically connected to the bonded points 324a of the substrate 320 through at least one conductive wire 341. In the fifth embodiment of the present invention, the substrate 320 includes a bottom wall 321 and side walls 323, wherein the bottom wall 321 and the side walls 323 are connected to form the recess. In the fifth embodiment of the present invention, the bonded points 324a are positioned on a top of the side walls 323, and one end of the conductive wire 341 is connected to the optical sensing member 340 while another end thereof is connected to one of the bonded points 324a.

The light emitting member 360 is electrically connected to the substrate 320. In the fifth embodiment of the present invention, the light emitting member 360 is electrically connected to the bonded points 324b of the substrate 320 through at least one conductive wire 361. In FIG. 6, the bonded points 324b are positioned on a top of the side walls 323, and one end of the conductive wire 361 is connected to the light emitting member 360 while another end thereof is connected to the bonded points 324b of the substrate 320.

According to embodiments of the present invention, by covering the transparent cover plate over the optical sensing member and the light emitting member, the optical sensing chip packaging structure could prevent dust or dirt from adhering to the optical sensing member and the light emitting member, and could prevent someone from contacting or pressing the optical sensing member and the light emitting member, so as to protect the optical sensing chip packaging structure. Therefore, a sensing precision of the optical sensing member and an entire reliability of the optical sensing chip packaging structure could be further enhanced.

It must be pointed out that the embodiments described above are only some preferred embodiments of the present invention. All equivalent structures which employ the concepts disclosed in this specification and the appended claims should fall within the scope of the present invention.

What is claimed is:

1. An optical sensing chip packaging structure, comprising:
   a substrate having a recess;
   an optical sensing member positioned in the recess and electrically connected to the substrate;
   a light emitting member positioned in the recess and electrically connected to the substrate or the optical sensing member; and
   a transparent cover plate positioned on the substrate and covering the optical sensing member and the light emitting member, wherein the transparent cover plate includes an optical grating which covers the optical sensing member.

2. The optical sensing chip packaging structure of claim 1, wherein the light emitting member has a light emitting surface facing to the transparent cover plate.

3. The optical sensing chip packaging structure of claim 1, wherein the optical sensing member has an optical sensing surface facing to the transparent cover plate.

4. The optical sensing chip packaging structure of claim 3, wherein a distance from the optical sensing surface to a bottom surface of the transparent cover plate is less than or equals to 0.8 mm.

5. The optical sensing chip packaging structure of claim 1, wherein the light emitting member is connected to a conductive wire, and one end of the conductive wire is connected to the optical sensing member, so that the light emitting member is electrically connected to the optical sensing member.

6. The optical sensing chip packaging structure of claim 1, wherein the light emitting member is connected to a conductive wire, and one end of the conductive wire is connected to the substrate, so that the light emitting member is electrically connected to the substrate.

7. The optical sensing chip packaging structure of claim 1, wherein the light emitting member is positioned on the optical sensing member.

8. The optical sensing chip packaging structure of claim 1, wherein the substrate has a separation wall positioned in the recess, so that the recess is separated to form a first accommodating space and a second accommodating space; the light emitting member is positioned in the first accommodating space, and the optical sensing member is positioned in the second accommodating space.

9. The optical sensing chip packaging structure of claim 8, wherein the separation wall is an opaque separation wall.

10. The optical sensing chip packaging structure of claim 1, wherein the optical grating is positioned on a top surface, a bottom surface or a combination of the both of the transparent cover plate.

11. An optical sensing chip packaging structure, comprising:
a substrate including a bottom wall and a plurality of side walls and having a recess and a plurality of circuit bonded points, wherein the bottom wall and the plurality of side walls are integrally formed as a monolithic unit; the plurality of circuit bonded points are positioned on a top of the plurality of side walls;
an optical sensing member positioned in the recess and electrically connected to the substrate;
a light emitting member positioned in the recess and electrically connected to the substrate or the optical sensing member; and
a transparent cover plate positioned on the substrate and covering the optical sensing member and the light emitting member.

12. The optical sensing chip packaging structure of claim 11, wherein the light emitting member has a light emitting surface facing to the transparent cover plate.

13. The optical sensing chip packaging structure of claim 11, wherein the optical sensing member has an optical sensing surface facing to the transparent cover plate.

14. The optical sensing chip packaging structure of claim 13, wherein a distance from the optical sensing surface to a bottom surface of the transparent cover plate is less than or equals to 0.8 mm.

15. The optical sensing chip packaging structure of claim 11, wherein the light emitting member is connected to a conductive wire, and one end of the conductive wire is connected to the optical sensing member, so that the light emitting member is electrically connected to the optical sensing member.

16. The optical sensing chip packaging structure of claim 11, wherein the light emitting member is connected to a conductive wire, and one end of the conductive wire is connected to the substrate, so that the light emitting member is electrically connected to the substrate.

17. The optical sensing chip packaging structure of claim 11, wherein the light emitting member is positioned on the optical sensing member.

18. The optical sensing chip packaging structure of claim 11, wherein the substrate has a separation wall positioned in the recess, so that the recess is separated to form a first accommodating space and a second accommodating space; the light emitting member is positioned in the first accommodating space, and the optical sensing member is positioned in the second accommodating space.

19. The optical sensing chip packaging structure of claim 18, wherein the separation wall is an opaque separation wall.

20. The optical sensing chip packaging structure of claim 11, wherein the transparent cover plate comprises an optical grating positioned on a top surface, a bottom surface or a combination of the both of the transparent cover plate.

* * * * *